US012628499B2

(12) United States Patent
Yang et al.

(10) Patent No.: US 12,628,499 B2
(45) Date of Patent: May 12, 2026

(54) DISPLAY DEVICE AND METHOD OF REPAIRING THE SAME

(71) Applicant: Samsung Display Co., Ltd., Yongin-si (KR)

(72) Inventors: Jiseong Yang, Yongin-si (KR); Gyeongeun Eoh, Yongin-si (KR); Myoungjong Lee, Yongin-si (KR); Songee Lee, Yongin-si (KR); Siwan Jeon, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 515 days.

(21) Appl. No.: 17/837,031

(22) Filed: Jun. 10, 2022

(65) Prior Publication Data

US 2023/0087551 A1     Mar. 23, 2023

(30) Foreign Application Priority Data

Sep. 23, 2021     (KR) ......................... 10-2021-0125915

(51) Int. Cl.
*H10K 59/122*         (2023.01)
*G09G 3/00*         (2006.01)
(Continued)

(52) U.S. Cl.
CPC ........... *H10K 59/122* (2023.02); *G09G 3/006* (2013.01); *H10K 50/854* (2023.02); *H10K 59/38* (2023.02)

(58) Field of Classification Search
CPC .... H10K 59/122; H10K 59/38; H10K 59/352; H10K 59/351; H10K 59/88;
(Continued)

(56) References Cited

U.S. PATENT DOCUMENTS 10,410,576 B2     9/2019  Choi
10,670,901 B2     6/2020  Lee et al.
(Continued)

FOREIGN PATENT DOCUMENTS

KR        10-1133072        4/2012
KR        10-1274877        6/2013
(Continued)

*Primary Examiner* — Shaun M Campbell
(74) *Attorney, Agent, or Firm* — CANTOR COLBURN LLP

(57)        ABSTRACT
A display device includes a pixel unit configured to emit light. The display device includes a lower substrate, a plurality of light-emitting devices, an upper substrate, a bank layer, and a functional layer. The plurality of light-emitting devices is on the lower substrate. The upper substrate is on the lower substrate. The plurality of light-emitting devices is between the upper substrate and the lower substrate. The bank layer is on one surface of the upper substrate facing the lower substrate. The bank layer includes partition walls defining a central opening corresponding to the pixel unit and an auxiliary opening adjacent to the central opening. The functional layer fills the central opening. The functional layer includes at least one of quantum dots and scattering particles. The plurality of light-emitting devices includes a main light-emitting device overlapping the central opening and an auxiliary light-emitting device overlapping the auxiliary opening.

11 Claims, 12 Drawing Sheets

(51) Int. Cl.
    *H10K 50/854*     (2023.01)
    *H10K 59/38*     (2023.01)

(58) Field of Classification Search
    CPC ...... H10K 50/854; G09G 3/006; G09G 3/207;
                        G09G 3/3208; G09G 2300/0426
    See application file for complete search history.

(56)              References Cited

U.S. PATENT DOCUMENTS

| | | | | |
|---|---|---|---|---|
| 10,804,334 | B2 | 10/2020 | Song et al. | |
| 2017/0186823 | A1* | 6/2017 | Kim | H10K 59/8792 |
| 2018/0074240 | A1 | 3/2018 | Bonar et al. | |
| 2018/0151108 | A1* | 5/2018 | Choi | H10K 59/80515 |
| 2019/0348470 | A1* | 11/2019 | Song | H10K 59/879 |
| 2020/0266253 | A1* | 8/2020 | Kim | H10K 59/38 |
| 2020/0321401 | A1* | 10/2020 | Ahn | H10K 59/38 |
| 2022/0173168 | A1* | 6/2022 | Kim | H10K 71/00 |
| 2023/0169916 | A1* | 6/2023 | Tseng | G09G 3/2096 |
| | | | | 345/694 |
| 2023/0247886 | A1* | 8/2023 | Lan | H10K 59/352 |
| | | | | 257/89 |

FOREIGN PATENT DOCUMENTS

| | | |
|---|---|---|
| KR | 10-2017-0137797 | 12/2017 |
| KR | 10-2018-0062268 | 6/2018 |
| KR | 10-2019-0057190 | 5/2019 |
| KR | 10-2019-0130697 | 11/2019 |
| KR | 10-2020-0100910 | 8/2020 |

* cited by examiner

DISPLAY DEVICE AND METHOD OF REPAIRING THE SAME

CROSS-REFERENCE TO RELATED APPLICATION

This application claims priority to and the benefit of Korean Patent Application No. 10-2021-0125915, filed Sep. 23, 2021, which is hereby incorporated by reference for all purposes as if fully set forth herein.

BACKGROUND

Field

One or more embodiments generally relate to a display device and a method of repairing the display device.

Discussion

A display device is a device for visually displaying data. Display devices are used as display units in small products, such as mobile phones, and large products, such as televisions. A display device may include a plurality of pixels that emit light by receiving an electrical signal to display an image to the outside. For a full-color display device, a plurality of pixels may emit light of different colors. To this end, at least some pixels of the display device may have a filter portion for converting colors. Accordingly, light of a first wavelength band generated by a light-emitting unit of some pixels may be converted into light of a second wavelength band while passing through a corresponding filter portion to be extracted to the outside.

The above information disclosed in this section is only for understanding the background of the inventive concepts, and, therefore, may contain information that does not form prior art.

SUMMARY

One or more embodiments are capable of providing a display device including a structure of a light-emitting display.

One or more embodiments are capable of providing a method of repairing a display device including a structure of a light-emitting display.

Additional aspects will be set forth in the detailed description which follows, and, in part, will be apparent from the disclosure, or may be learned by practice of the inventive concepts.

According to an embodiment, a display device includes a pixel unit configured to emit light. The display device includes a lower substrate, a plurality of light-emitting devices, an upper substrate, a bank layer, and a functional layer. The plurality of light-emitting devices is on the lower substrate. The upper substrate is on the lower substrate. The plurality of light emitting devices is between the upper substrate and the lower substrate. The bank layer is on one surface of the upper substrate facing the lower substrate. The bank layer includes partition walls defining a central opening corresponding to the pixel unit and an auxiliary opening adjacent to the central opening. The functional layer fills the central opening. The functional layer includes at least one of quantum dots and scattering particles. The plurality of light-emitting devices includes a main light-emitting device overlapping the central opening and an auxiliary light-emitting device overlapping the auxiliary opening.

According to an embodiment, a method of repairing a display device including a bank layer arranged on an upper substrate, the bank layer including partition walls defining a central opening corresponding to a pixel unit configured to emit light and an auxiliary opening adjacent to the central opening, includes: forming a replacement pixel unit using the auxiliary opening arranged adjacent to the central opening corresponding to the pixel unit including a defect; and replacing the defective pixel unit using the replacement pixel unit. Replacing the defective pixel unit includes: cutting off a path configured to supply power to a light-emitting device overlapping the defective pixel unit; and forming a path configured to supply power to a light-emitting device overlapping the replacement pixel unit.

The foregoing general description and the following detailed description are illustrative and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate embodiments of the inventive concepts, and, together with the description, serve to explain principles of the inventive concepts. In the drawings:

FIG. 4 is a cross-sectional view of the display device of FIG. 3A taken along sectional line I-I' according to an embodiment;

Figure 7:
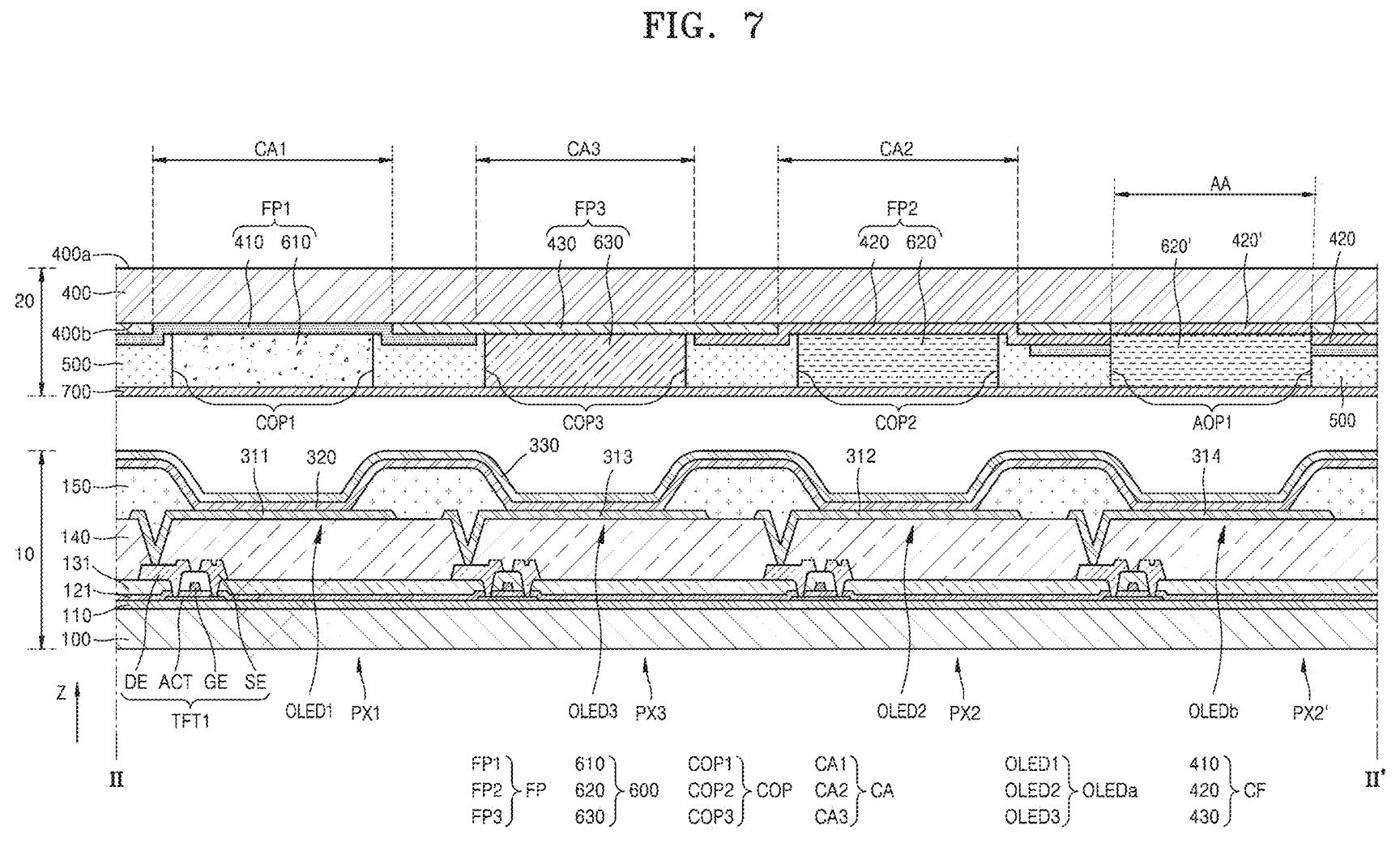

FIG. 7 is a cross-sectional view of the display device of FIG. 5 taken along sectional line according to an embodiment; and FIG. 8 is a cross-sectional view of a portion of a display device in which a defective pixel is repaired according to an embodiment.

DETAILED DESCRIPTION OF SOME EMBODIMENTS

Figure 1:
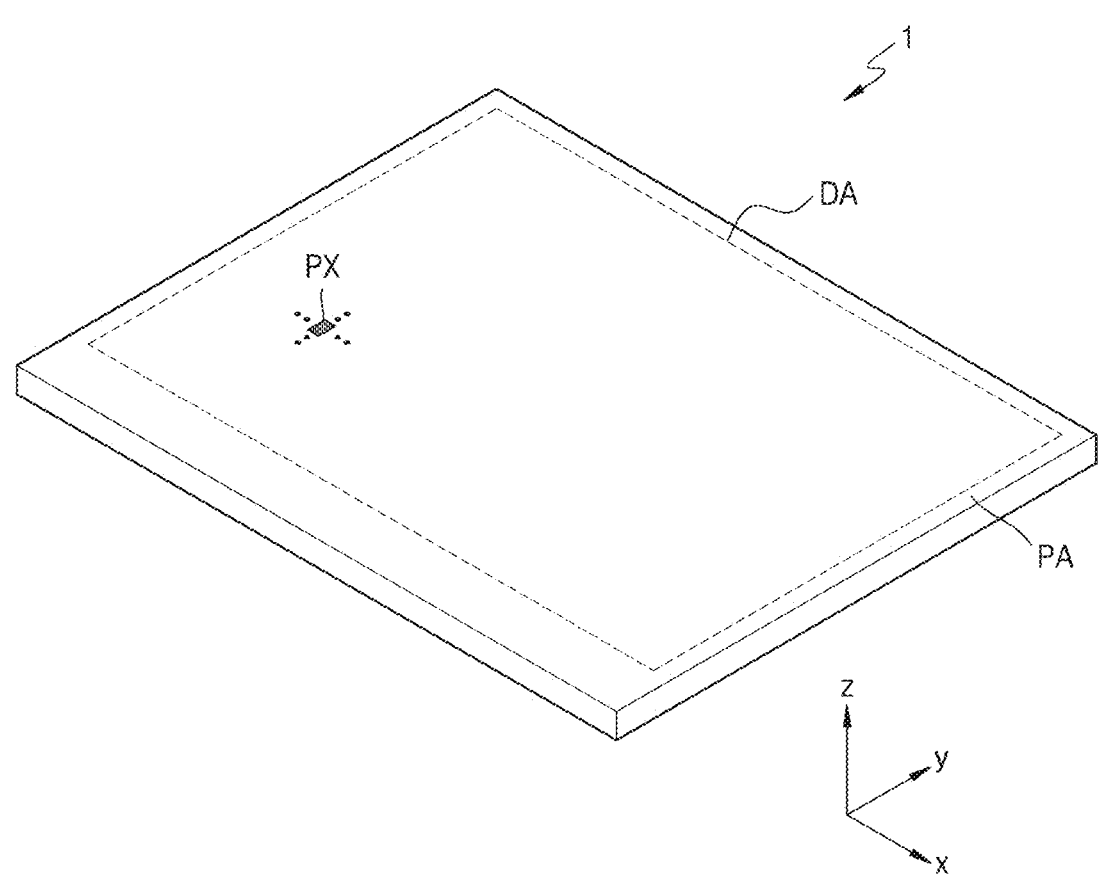
FIG. 1 is a perspective view of a display device according to an embodiment.

In the following description, for the purposes of explanation, numerous specific details are set forth in order to provide a thorough understanding of various embodiments. As used herein, the terms "embodiments" and "implementations" may be used interchangeably and are non-limiting examples employing one or more of the inventive concepts disclosed herein. It is apparent, however, that various embodiments may be practiced without these specific details or with one or more equivalent arrangements. In other instances, well-known structures and devices are shown in block diagram form to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing example features of varying detail of some embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. In addition, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing some embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional views, isometric views, perspective views, plan views, and/or exploded illustrations that are schematic illustrations of idealized embodiments and/or intermediate structures. As such, variations from the shapes of the illustrations as a result of, for example, manufacturing techniques and/or tolerances, are to be expected. Thus, embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, various embodiments will be explained in detail with reference to the accompanying drawings.

FIG. 1 is a perspective view of a display device 1 according to an embodiment.

Referring to FIG. 1, the display device 1 may include a display area DA for implementing an image and a non-display area NDA for not implementing an image. The display device 1 may provide an image to the outside using light emitted from the display area DA.

Although FIG. 1 shows the display device 1 in which the display area DA is rectangular, in another embodiment, the display area DA may be a circle, an ellipse, or a polygon, such as a triangle or a pentagon. In addition, although the display device 1 of FIG. 1 illustrates a flat panel display device, the display device 1 may be implemented in various forms, such as a flexible display device, a foldable display device, a rollable display device, a twistable display device, and/or the like.

In an embodiment, the display device 1 may be an organic light-emitting display device. In another embodiment, the display device 1 may be an inorganic light-emitting display device or a quantum dot light-emitting display device. For example, a light-emitting layer of a light-emitting device included in a display device may include an organic material, an inorganic material, a quantum dot, a quantum rod, an organic material and a quantum dot (and/or rod), an inorganic material and a quantum dot (and/or rod), or an organic material, an inorganic material, and a quantum dot (and/or rod). It is contemplated, however, that any other suitable display device may be utilized in association with embodiments. Hereinafter, for the convenience of description, a case in which the display device 1 is an organic light-emitting display will be described in more detail.

A plurality of pixels PX may be arranged in the display area DA. In this specification, the pixels PX refer to sub-pixels emitting light of different colors, and each pixel PX may be, for example, one of a red sub-pixel, a green sub-pixel, and a blue sub-pixel, but any additional (or alternative) colors may be utilized.

Figure 2:
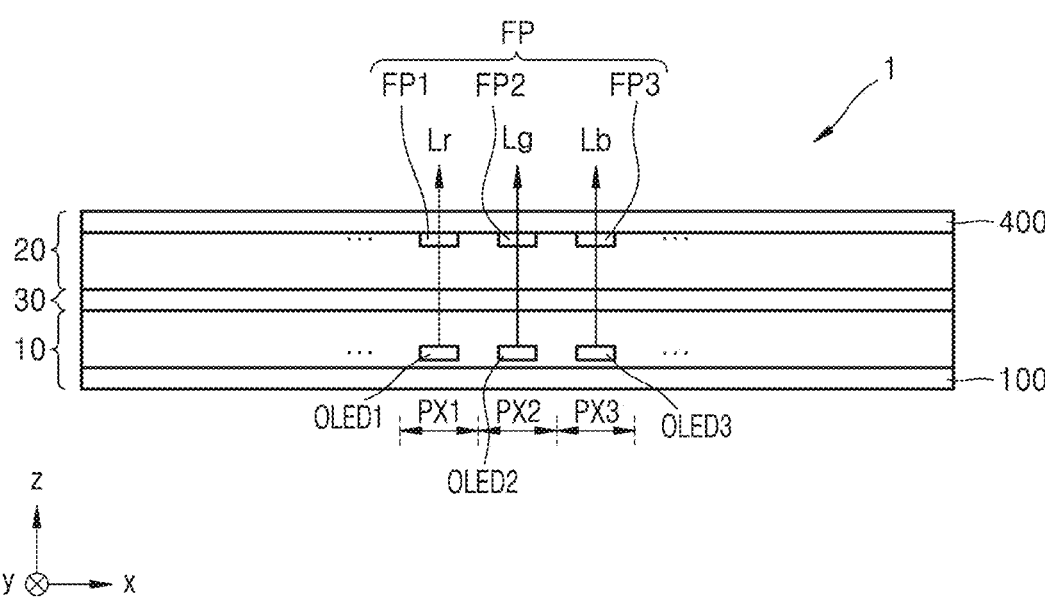
FIG. 2 is a cross-sectional view of a portion of a display device according to an embodiment.

FIG. 2 is a cross-sectional view schematically illustrating the display device 1 according to an embodiment.

Referring to FIG. 2, the display device 1 may include a first pixel PX1, a second pixel PX2, and a third pixel PX3. The first pixel PX1, the second pixel PX2, and the third pixel PX3 may be pixels emitting light of different colors. For example, the first pixel PX1 may emit red light Lr, the second pixel PX2 may emit green light Lg, and the third pixel PX3 may emit blue light Lb.

In an embodiment, the display device 1 may include a display panel 10 and a color conversion panel 20. The display panel 10 may include a lower substrate 100 and a light-emitting device. The light-emitting device may be, for example, an organic light-emitting diode. In an embodiment, each of the first pixel PX1, the second pixel PX2, and the third pixel PX3 may include an organic light-emitting diode. For example, the first pixel PX1 may include a first organic light-emitting diode OLED1. The second pixel PX2 may include a second organic light-emitting diode OLED2. The third pixel PX3 may include a third organic light-emitting diode OLED3.

In an embodiment, the first organic light-emitting diode OLED1, the second organic light-emitting diode OLED2, and the third organic light-emitting diode OLED3 may emit blue light. In another embodiment, the first organic light-emitting diode OLED1, the second organic light-emitting diode OLED2, and the third organic light-emitting diode OLED3 may emit red light Lr, green light Lg, and blue light Lb, respectively.

The color conversion panel 20 may include an upper substrate 400 and a filter portion FP. In an embodiment, the filter portion FP may include a first filter portion FP1, a second filter portion FP2, and a third filter portion FP3. Light emitted from the first organic light-emitting diode OLED1 may pass through the first filter portion FP1 and be emitted as the red light Lr. Light emitted from the second organic light-emitting diode OLED2 may pass through the second filter portion FP2 and be emitted as the green light Lg. Light emitted from the third organic light-emitting diode OLED3 may pass through the third filter portion FP3 and be emitted as the blue light Lb.

In an embodiment, the filter portion FP may include a functional layer and a color filter layer. In an embodiment, the functional layer may include a first quantum dot layer, a second quantum dot layer, and a light-transmitting layer. In an embodiment, the color filter layer may include a first color filter, a second color filter, and a third color filter. The first filter portion FP1 may include a first quantum dot layer and a first color filter. The second filter portion FP2 may include a second quantum dot layer and a second color filter. The third filter portion FP3 may include a light-transmitting layer and a third color filter.

The filter portion FP may be located directly on the upper substrate 400. In this case, positioning directly on the upper substrate 400 may mean manufacturing the color conversion panel 20 by directly forming the first color filter, the second color filter, and the third color filter directly on the upper substrate 400. Thereafter, the color conversion panel 20 may be bonded to the display panel 10 so that the first filter portion FP1, the second filter portion FP2, and the third filter portion FP3 face the first organic light-emitting diode OLED1, the second organic light-emitting diode OLED2, and the third organic light-emitting diode OLED3, respectively.

The display panel 10 and the color conversion panel 20 may be bonded to each other with an adhesive layer 30. The adhesive layer 30 may be, for example, an optically clear adhesive (OCA), a liquid optically clear adhesive (LOCA), an optically clear resin (OCR), a pressure sensitive adhesive (PSA), and/or the like. In another embodiment, the display panel 10 may be bonded to the color conversion panel 20 through a filler. In another embodiment, the adhesive layer and/or the filler may be omitted.

Figure 3A:
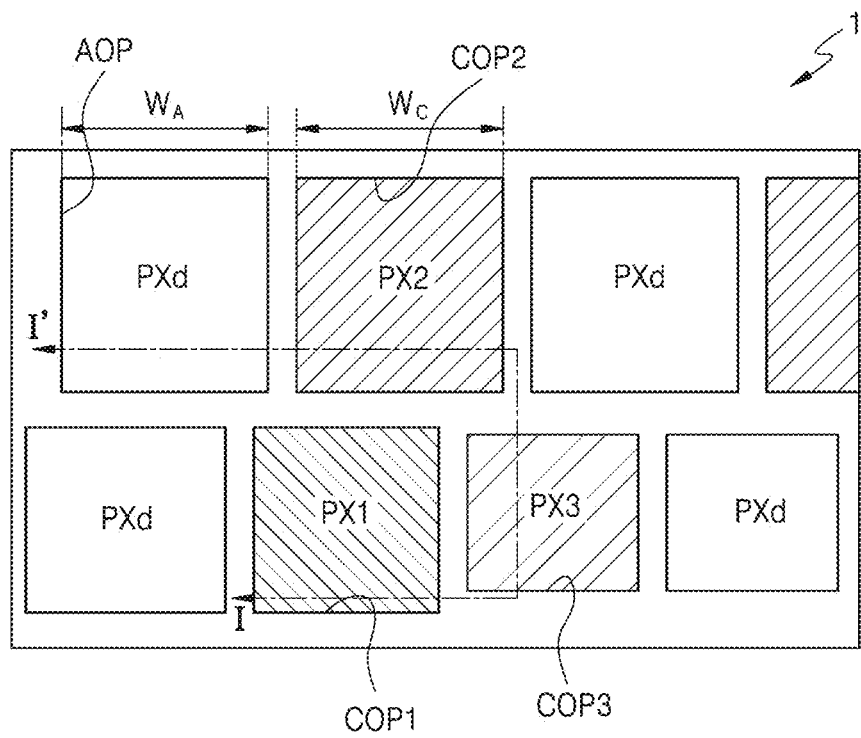
FIGS. 3A and 3B are plan views of a display device according to an embodiment.
Figure 3B:
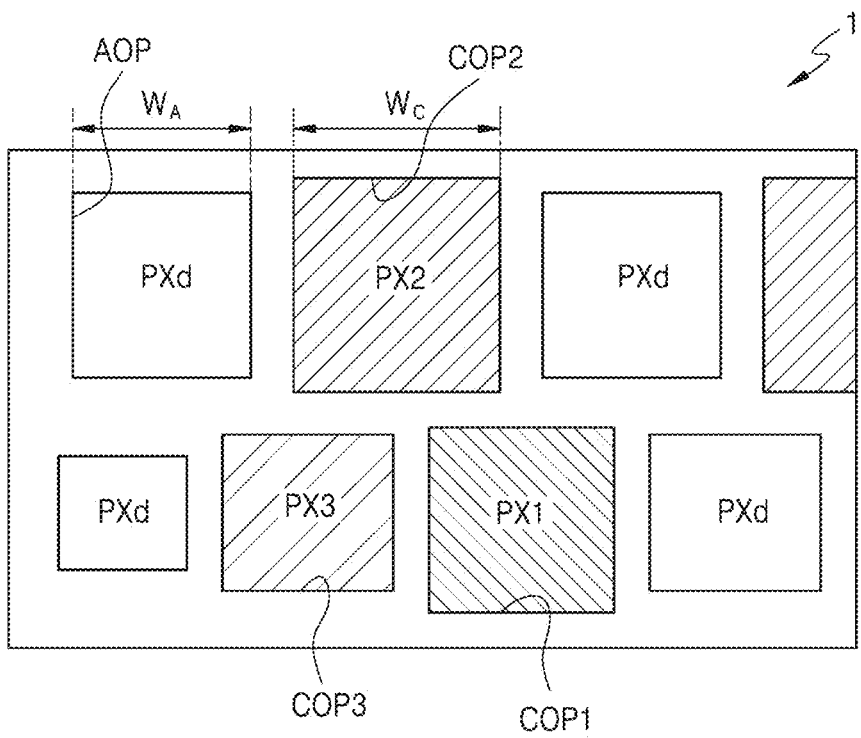
Figure 4:
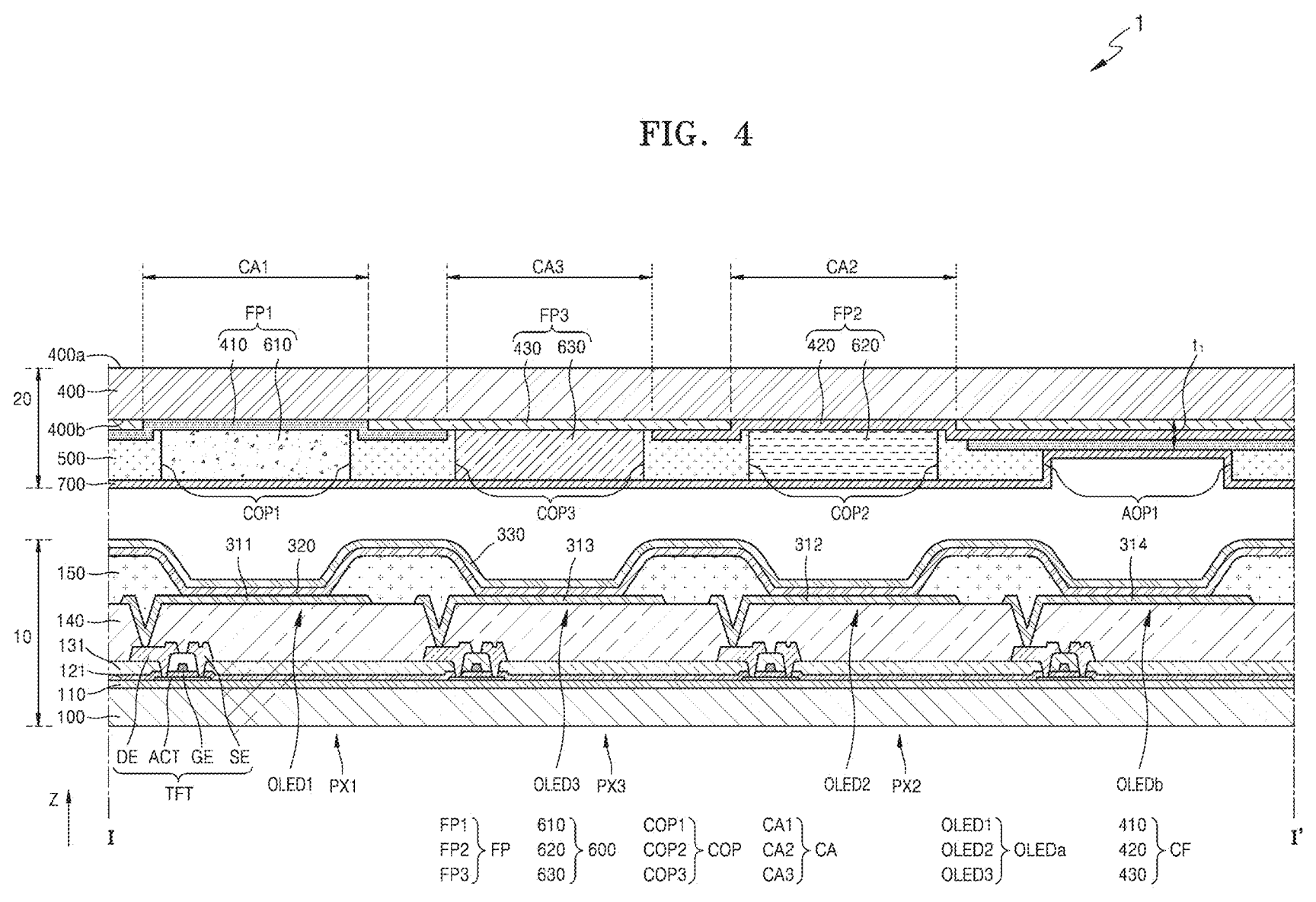

FIGS. 3A and 3B are plan views schematically illustrating the display device 1 according to an embodiment. FIG. 4 is a cross-sectional view of the display device 1 taken along sectional line I-I' of FIG. 3A according to an embodiment.

Referring to FIG. 3A, the display device 1 may include a first pixel PX1, a second pixel PX2, a third pixel PX3, and a dummy pixel PXd.

The first pixel PX1, the second pixel PX2, and the third pixel PX3 are pixels that implement light, and the first pixel PX1, the second pixel PX2, and the third pixel PX3 may implement different lights. For example, the first pixel PX1 may implement red light, the second pixel PX2 may implement green light, and the third pixel PX3 may implement blue light.

The dummy pixel PXd may be a pixel for implementing a replacement pixel when a defect occurs in the first pixel PX1, the second pixel PX2, and/or the third pixel PX3. The dummy pixel PXd may not implement light when a defect does not occur in an adjacent pixel. In this case, a light shielding material may be arranged in an area of the dummy pixel PXd.

A plurality of dummy pixels PXd may be provided, and each of the plurality of dummy pixels PXd may be arranged adjacent to the first pixel PX1, the second pixel PX2, and the third pixel PX3. Alternatively, the dummy pixel PXd may be arranged adjacent to some of the first pixel PX1, the second pixel PX2, and the third pixel PX3.

An arrangement relationship between the dummy pixel PXd and the first pixel PX1, the second pixel PX2, and the third pixel PX3 may be variously modified. Although the drawing shows that the first pixel PX1, the second pixel PX2, and the third pixel PX3 are arranged adjacent to each other and the dummy pixel PXd is arranged outside the first pixel PX1, the second pixel PX2, and the third pixel PX3, in another embodiment, the dummy pixel PXd may be alternately arranged with the first to third pixels PX1, PX2, and PX3.

A color conversion panel of the display device 1 may include a first opening COP1, a second opening COP2, and a third opening COP3 that are central openings COP (see FIG. 4) corresponding to the first to third pixels PX1, PX2, and PX3, and a bank layer having an auxiliary opening AOP may be arranged to correspond to the dummy pixel PXd. In FIGS. 3A and 3B, the first pixel PX1, the second pixel PX2, and the third pixel PX3, that is, the first opening COP1, a second opening COP2, and a third opening COP3 are arranged adjacent to each other, and auxiliary openings AOP are arranged on both sides to surround them. However, positions of the first pixel PX1, the second pixel PX2, and the third pixel PX3 and the auxiliary openings AOP may vary.

The auxiliary opening AOP may have a size equal to or less than that of an adjacent central opening COP in a plan view. In an embodiment, as shown in FIG. 3A, a width $W_A$ in a first direction of the auxiliary opening AOP may be the same as a width $W_C$ in the first direction of an adjacent central opening in a plan view. In an embodiment, as shown in FIG. 3B, the width $W_A$ in the first direction of the auxiliary opening AOP may be less than the width $W_C$ in the first direction of the adjacent central opening in a plan view.

In an embodiment, each of the plurality of auxiliary openings AOP may have a size equal to or less than a size of a nearest opening from among the first opening COP1, the second opening COP2, and the third opening COP3. In an embodiment, a first auxiliary opening AOP1 (see FIG. 4) may be arranged closest to the second opening COP2 and may have the same size as that of the second opening COP2.

Referring to FIG. 4, the display device 1 may include the display panel 10 and the color conversion panel 20.

The display panel 10 may include the lower substrate 100 and the light-emitting device arranged on the lower substrate 100. A plurality of light-emitting devices may include a main light-emitting device OLEDa and an auxiliary light-emitting device OLEDb. In an embodiment, the main light-emitting diode OLEDa may include the first organic light-emitting diode OLED1, the second organic light-emitting diode OLED2, and the third organic light-emitting diode OLED3.

The color conversion panel 20 may include a bank layer 500 having a plurality of openings defined therein. In the bank layer 500, the central opening COP and the auxiliary opening AOP arranged adjacent to the central opening COP may be defined by partition walls. The central opening COP may include the first opening COP1, the second opening COP2, and the third opening COP3. In an embodiment, a plurality of central openings COP may be provided. The plurality of central openings COP may include a plurality of first openings COP1, a plurality of second openings COP2, and a plurality of third openings COP3. The auxiliary opening AOP may include a plurality of auxiliary openings, such as the first auxiliary opening AOP1.

The auxiliary opening AOP may be arranged adjacent to the central opening COP. In an embodiment, each of the plurality of auxiliary openings may be arranged adjacent to at least one of the first opening COP1, the second opening COP2, and the third opening COP3. In an embodiment, the first auxiliary opening AOP1 may be arranged closest to the second opening COP2.

The central opening COP may overlap a central area CA corresponding to a pixel unit. In an embodiment, the plurality of central openings COP may overlap the central area CA. For example, the first opening COP1 may overlap a first central area CA1 corresponding to the first pixel PX1. The second opening COP2 may overlap a second central area CA2 corresponding to the second pixel PX2. The third opening COP3 may overlap a third central area CA3 corresponding to the third pixel PX3.

The central opening COP may overlap the central area CA corresponding to the pixel unit. The central area CA may overlap the main light-emitting device OLEDa. In this manner, the central opening COP may overlap the main light-emitting device OLEDa. In an embodiment, the first opening COP1 may overlap the first organic light-emitting diode OLED1. The second opening COP2 may overlap the second organic light-emitting diode OLED2. The third opening COP3 may overlap the third organic light-emitting diode OLED3.

The auxiliary opening AOP may overlap the auxiliary light-emitting device OLEDb. In other words, the auxiliary light-emitting device OLEDb may be arranged on the lower substrate 100 to overlap the auxiliary opening AOP. In an embodiment, the auxiliary light-emitting device OLEDb overlapping the first auxiliary opening AOP1 may include a fourth pixel electrode 314, an opposite electrode 330 arranged to correspond to the fourth pixel electrode 314, and a light-emitting layer 320 interposed therebetween. Because the description of the structure of the main light-emitting device OLEDa may be applied to the structure of the auxiliary light-emitting device OLEDb, the description of the main light-emitting device OLEDa will be hereinafter replaced.

The light-emitting device may include the light-emitting layer 320. In an embodiment, the display panel 10 may include the first organic light-emitting diode OLED1, the second organic light-emitting diode OLED2, and the third organic light-emitting diode OLED3 arranged on the lower substrate 100. The first organic light-emitting diode OLED1, the second organic light-emitting diode OLED2, and the third organic light-emitting diode OLED3 may include the light-emitting layer 320.

Hereinafter, a stacked structure of the display panel 10 will be described in more detail.

The lower substrate 100 may include at least one of a glass material, a ceramic material, a metal material, and a material having flexible or bendable properties. When the lower substrate 100 is flexible or bendable, the lower substrate 100 may include a polymer resin, such as at least one of polyethersulfone, polyacrylate, polyetherimide, polyethylene naphthalate, polyethylene terephthalate, polyphenylene sulfide, polyarylate, polyimide, polycarbonate, and cellulose acetate propionate. The substrate 100 may have a single layer or a multilayer structure of the material, and in the case of the multilayer structure, may further include an inorganic layer. In an embodiment, the lower substrate 100 may have an organic layer/inorganic layer/organic layer structure.

In some embodiments, a barrier layer may be further included between the lower substrate 100 and a buffer layer 110. The barrier layer may prevent or minimize penetration of impurities from the lower substrate 100 into a semiconductor layer ACT. The buffer layer may include an inorganic material, such as at least one of an oxide or nitride, an organic material, and an organic-inorganic composite material, and may have a single layer structure or a multilayer structure including an inorganic material and/or an organic material.

A bias electrode may be arranged on the buffer layer 110 to correspond to a thin film transistor TFT. In an embodiment, a voltage may be applied to the bias electrode. In addition, the bias electrode may prevent external light from reaching the semiconductor layer ACT. Accordingly, characteristics of the thin film transistor TFT may be stabilized. A bias electrode may be omitted in some cases.

The semiconductor layer ACT may be arranged on the buffer layer 110. The semiconductor layer ACT may include amorphous silicon or polysilicon. In another embodiment, the semiconductor layer ACT may include an oxide of at least one of indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). In some embodiments, the semiconductor layer ACT is a Zn oxide-based material, and may be formed of Zn oxide, In—Zn oxide, Ga—In—Zn oxide, and/or the like. In another embodiment, the semiconductor layer ACT may be an IGZO (In—Ga—Zn—O), ITZO (In—Sn—Zn—O), and/or IGTZO (In—Ga—Sn—Zn—O) semiconductor in which ZnO includes a metal such as at least one of indium (In), gallium (Ga), and tin (Sn). The semiconductor layer ACT may include a channel area, and a source area and a drain area arranged on both sides of the channel area. The semiconductor layer ACT may be formed of a single layer or multiple layers.

A gate electrode GE may be arranged on the semiconductor layer ACT with a gate insulating layer 121 therebetween. The gate electrode GE may at least partially overlap the semiconductor layer ACT. The gate electrode GE includes at least one of molybdenum (Mo), aluminum (Al), copper (Cu), titanium (Ti), and the like, and may be formed of a single layer or multiple layers.

An interlayer insulating layer 131 may be provided to cover the gate electrode GE. The interlayer insulating layer 131 may include at least one of silicon oxide, silicon nitride, silicon oxynitride, aluminum oxide, titanium oxide, tantalum oxide, hafnium oxide, and zinc oxide.

A source electrode SE and a drain electrode DE may be arranged on the interlayer insulating layer 131. The source electrode SE and the drain electrode DE may include a conductive material including at least one of Mo, Al, Cu, Ti, and the like, and may be formed of a single layer or multiple layers including one or more of the above-described materials. For example, the source electrode SE and the drain electrode DE may have a multilayer structure of Ti/Al/Ti. The source electrode SE and the drain electrode DE may be respectively connected to the source area and the drain area of the semiconductor layer ACT through respective contact holes extending through the interlayer insulating layer 131 and the gate insulating layer 121.

A planarization layer 140 may be arranged on the source electrode SE and the drain electrode DE. The planarization layer 140 may be formed of a single layer or multiple layers of an organic material, and may provide a flat top surface. The planarization layer 140 may include a general polymer, such as at least one of benzocyclobutene (BCB), polyimide (PI), hexamethyldisiloxane (HMDSO), polymethylmethacrylate (PMMA), and polystyrene (PS), a polymer derivative including a phenolic group, an acrylic polymer, an imide polymer, an aryl ether polymer, an amide polymer, a fluorine-based polymer, a p-xylene-based polymer, and a vinyl alcohol polymer, or any suitable blend of one or more of the aforementioned materials.

The light-emitting device may be on the planarization layer 140. In an embodiment, the first organic light-emitting diode OLED1, the second organic light-emitting diode OLED2, and the third organic light-emitting diode OLED3 may be arranged on the planarization layer 140. The first organic light-emitting diode OLED1, the second organic light-emitting diode OLED2, and the third organic light-emitting diode OLED3 may include a first pixel electrode 311, a second pixel electrode 312, and a third pixel electrode 313, respectively. In an embodiment, the first organic light-emitting diode OLED1, the second organic light-emitting diode OLED2, and the third organic light-emitting diode OLED3 may include the light-emitting layer 320 and the opposite electrode 330 in common, but embodiments are not limited thereto.

The first pixel electrode 311, the second pixel electrode 312, and the third pixel electrode 313 may be a (semi)-transmissive electrode and/or a reflective electrode. In some embodiments, the first pixel electrode 311, the second pixel electrode 312, and the third pixel electrode 313 may include a reflective layer formed of at least one of silver (Ag), magnesium (Mg), aluminum (Al), platinum (Pt), palladium (Pd), gold (Au), nickel (Ni), neodymium (Nd), iridium (Ir), and chromium (Cr), or any suitable compound of one or more of the aforementioned materials, and a transparent or semi-transparent electrode layer formed above the reflective layer. The transparent or semi-transparent electrode layer may include at least one of indium tin oxide (ITO), indium zinc oxide (IZO), zinc oxide (ZnO), indium oxide (In$_2$O$_3$), indium gallium oxide (IGO), and aluminum zinc oxide (AZO). In some embodiments, the first pixel electrode 311, the second pixel electrode 312, and the third pixel electrode 313 may be formed with a multiple layer structure of ITO/Ag/ITO.

A pixel-defining layer 150 may be arranged on the planarization layer 140. The pixel-defining layer 150 may include openings respectively exposing portions (e.g., central portions) of the first pixel electrode 311, the second pixel electrode 312, and the third pixel electrode 313. The pixel-defining layer 150 may cover edges of the first pixel electrode 311, the second pixel electrode 312, and the third pixel electrode 313, respectively. The pixel-defining layer 150 may prevent generation of an arc on the edges of the first pixel electrode 311, the second pixel electrode 312, and the third pixel electrode 313 by increasing a distance between the edges of the first pixel electrode 311, the second pixel electrode 312, and the third pixel electrode 313 and the opposite electrode 330 on the first pixel electrode 311, the second pixel electrode 312, and the third pixel electrode 313.

The pixel-defining layer 150 may include at least one organic insulating material from among PI, polyamide, acrylic resin, BCB, and phenolic resin, and may be formed by spin coating or the like.

The light-emitting layer 320 of the first organic light-emitting diode OLED1, the second organic light-emitting diode OLED2, and the third organic light-emitting diode OLED3 may include an organic material including a fluorescent or phosphorescent material emitting red, green, blue, or white light. The light-emitting layer 320 may be a low molecular weight organic material or a high molecular weight organic material, and a functional layer, such as a hole transport layer (HTL), a hole injection layer (HIL), an electron transport layer (ETL), and/or an electron injection layer (EIL), may be selectively further arranged over and/or below the light-emitting layer 320. Although FIG. 4 shows that the light-emitting layer 320 is integrally formed over the first pixel electrode 311, the second pixel electrode 312, and the third pixel electrode 313, embodiments are not limited thereto. The light-emitting layer 320 may have various modifications, such as being arranged to respectively correspond to each of the first pixel electrode 311, the second pixel electrode 312, and the third pixel electrode 313.

The light-emitting layer 320 may include an integral layer over the first pixel electrode 311, the second pixel electrode 312, and the third pixel electrode 313 as described above, and in some embodiments, may include a layer patterned to correspond to each of the first pixel electrode 311, the second pixel electrode 312, and the third pixel electrode 313. In any case, the light-emitting layer 320 may be a first color light-emitting layer. The first color light-emitting layer may be integrally formed over the first pixel electrode 311, the second pixel electrode 312, and the third pixel electrode 313, and in some embodiments, may be patterned to correspond to each of the first pixel electrode 311, the second pixel electrode 312, and the third pixel electrode 313. The first color light-emitting layer may emit light of a first wavelength band, for example, light having a wavelength of 450 nm to 495 nm.

The opposite electrode 330 may be located on the light-emitting layer 320 to correspond to the first pixel electrode 311, the second pixel electrode 312, and the third pixel electrode 313. The opposite electrode 330 may be integrally formed in a plurality of organic light-emitting devices. In some embodiments, the opposite electrode 330 may be a transparent electrode or semi-transparent electrode, and may include a metal thin-film, which has a small work function, including at least one of Li, Ca, lithium fluoride (LiF)/Ca, LiF/Al, Al, Ag, and Mg, or any suitable compound of one or more of the aforementioned materials. Furthermore, a transparent conductive oxide (TCO) layer including, such as at least one of ITO, IZO, ZnO, and $In_2O_3$, may further be arranged on the metal thin-film.

In some embodiments, a spacer for preventing damage to a mask may be further included on the pixel-defining layer 150. The spacer may be formed integrally with the pixel-defining layer 150. For example, the spacer and the pixel-defining layer 150 may be simultaneously formed in an identical process using a halftone mask process.

Because the first organic light-emitting diode OLED1, the second organic light-emitting diode OLED2, and the third organic light-emitting diode OLED3 may be easily damaged by moisture or oxygen from the outside, they may be protected by covering them with an encapsulation layer. The encapsulation layer may cover the display area DA and extend to the outside of the display area DA. The encapsulation layer may include at least one organic encapsulation layer and at least one inorganic encapsulation layer. For example, the encapsulation layer may include an inorganic encapsulation layer and an organic encapsulation layer. In another embodiment, the encapsulation layer may include a first inorganic encapsulation layer, an organic encapsulation layer, and a second inorganic encapsulation layer.

The inorganic encapsulation layer may include at least one inorganic material from among at least one of aluminum oxide, titanium oxide, tantalum oxide, hafnium oxide, zinc oxide, silicon oxide, silicon nitride, and silicon oxynitride. The organic encapsulation layer may include a polymer-based material. Examples of the polymer-based material may include at least one of an acrylic resin, an epoxy resin, polyimide, and polyethylene. In an embodiment, the organic encapsulation layer may include acrylate.

Even if cracks occur in the encapsulation layer through the multilayer structure described above, the encapsulation layer may prevent the cracks from being connected to each other between the inorganic encapsulation layer and the organic encapsulation layer. In this manner, the formation of a penetration path of external moisture or oxygen into the display area DA may be prevented or minimized.

In some embodiments, other layers, such as a capping layer, may be disposed between the encapsulation layer and the opposite electrode 330.

The color conversion panel 20 may include the upper substrate 400, a color filter layer CF, the bank layer 500, and a functional layer 600.

The upper substrate 400 may include at least one of glass, metal, and polymer resin. When the upper substrate 400 is flexible or bendable, the upper substrate 400 may include a polymer resin, such as at least one of polyethersulfone, polyacrylate, polyetherimide, polyethylene naphthalate, polyethylene terephthalate, polyphenylene sulfide, polyarylate, polyimide, polycarbonate, and cellulose acetate propionate. In an embodiment, the upper substrate 400 may have a multilayer structure including two layers each including such a polymer resin and a barrier layer including an inorganic material, such as at least one of silicon oxide (SiOx), silicon nitride (SiNx), and silicon oxynitride (SiON) interposed between the two layers.

The color filter layer CF may be on a lower surface 400*b* of the upper substrate 400 in a direction from the upper substrate 400 to the lower substrate 100. The color filter layer CF may include a first color filter 410, a second color filter 420, and third color filters 430. The first color filter 410 may be arranged on the first central area CA1. The second color filter 420 may be arranged on the second central area CA2. The third color filter 430 may be arranged on the third central area CA3. The first color filter 410, the second color filter 420, and the third color filter 430 may include a photosensitive resin material. Each of the first color filter 410, the second color filter 420, and the third color filter 430 may include a dye representing a unique color. The first color filter 410 may pass only light having a wavelength of 630 nm to 780 nm, the second color filter 420 may pass only light having a wavelength of 495 nm to 570 nm, and the third color filter 430 may pass only light having a wavelength of 450 nm to 495 nm.

The color filter layer CF may reduce external light reflection of the display device 1. For example, when external light reaches the first color filter 410, only light of a preset wavelength as described above may pass through the first color filter 410, and light of other wavelengths may be absorbed by the first color filter 410. Accordingly, only the light of the preset wavelength from among external light incident on the display device 1 may pass through the first color filter 410, and a portion thereof may be reflected by the opposite electrode 330 and/or the first pixel electrode 311 thereunder and then emitted to the outside again. Because only a portion of external light incident on the first pixel PX1 is reflected to the outside, the first color filter layer 410 may reduce external light reflection. This description may also be applied to the second color filter 420 and the third color filter 430.

The first color filter 410, the second color filter 420, and the third color filter 430 may overlap each other. The first color filter 410, the second color filter 420, and the third color filter 430 may overlap each other between any one of central areas CA and the other of the central areas CA. For example, the first color filter 410, the second color filter 420, and the third color filter 430 may overlap each other between the first central area CA1 and the second central area CA2. In this case, the third color filter 430 may be between the first central area CA1 and the second central area CA2. The first color filter 410 may extend from the first central area CA1 to overlap the third color filter 430. The second color filter 420 may extend from the second central area CA2 to overlap the third color filter 430.

The first color filter 410, the second color filter 420, and the third color filter 430 may overlap each other between the second central area CA2 and the third central area CA3. The first color filter 410 may be between the second central area CA2 and the third central area CA3. The second color filter 420 may extend from the second central area CA2 to overlap the first color filter 410. The third color filter 430 may extend from the third central area CA3 to overlap the first color filter 410.

The first color filter 410, the second color filter 420, and the third color filter 430 may overlap each other between the third central area CA3 and the first central area CA1. The second color filter 420 may be between the third central area CA3 and the first central area CA1. The third color filter 430 may extend from the third central area CA3 to overlap the second color filter 420. The first color filter 410 may extend from the first central area CA1 to overlap the second color filter 420.

As described above, the first color filter 410, the second color filter 420, and the third color filter 430 may overlap to serve as a light shielding unit. Even without a separate light shielding member, the color filter layer CF may prevent or reduce color mixing.

In an embodiment, the third color filter 430 may be stacked first on the upper substrate 400. This is because the third color filter 430 may partially absorb external light incident from the outside of the upper substrate 400 to reduce the reflectance of the display device 1, and light reflected by the third color filter 430 is hardly recognized by a user.

The bank layer 500 may be on the color filter layer CF. The bank layer 500 may include an organic material. In some cases, the bank layer 500 may include a light shielding material to function as a light shielding layer. The light shielding material may include, for example, at least one of a black pigment, a black dye, a black particle, and a metal particle.

The functional layer 600 may fill the central opening COP of the bank layer 500. In an embodiment, the functional layer 600 may include at least one of quantum dots and scattering particles. In an embodiment, the functional layer 600 may include a first quantum dot layer 610, a second quantum dot layer 620, and a light-transmitting layer 630.

The first quantum dot layer 610 may overlap the first central area CA1. The first quantum dot layer 610 may fill the first opening COP1. The first pixel PX1 may include the first organic light-emitting diode OLED1 and the first quantum dot layer 610.

The first quantum dot layer 610 may convert light of a first wavelength band generated by the light-emitting layer 320 on the first pixel electrode 311 into light of a second wavelength band. For example, when light having a wavelength of 450 nm to 495 nm is generated in the light-emitting layer 320 on the first pixel electrode 311, the first quantum dot layer 413 may convert the light into light having a wavelength of 630 nm to 780 nm. As such, in the first pixel PX1, the light having a wavelength of 630 nm to 780 nm may be emitted to the outside through the upper substrate 400. In an embodiment, the first quantum dot layer 610 may have a form in which quantum dots are dispersed in a resin. In an embodiment, the first quantum dot layer 610 may include scattering particles.

The second quantum dot layer 620 may overlap the second central area CA2. The second quantum dot layer 620 may fill the second opening COP2. The second pixel PX2 may include the second organic light-emitting diode OLED2 and the second quantum dot layer 620.

The second quantum dot layer 620 may convert light of a first wavelength band generated by the light-emitting layer 320 on the second pixel electrode 312 into light of a third wavelength band. For example, when light having a wavelength of 450 nm to 495 nm is generated in the light-emitting layer 320 on the second pixel electrode 312, the second quantum dot layer 620 may convert the light into light having a wavelength of 495 nm to 570 nm. As such, in the second pixel PX2, the light having a wavelength of 495 nm to 570 nm may be emitted to the outside through the upper substrate 400. In an embodiment, the second quantum dot layer 620 may have a form in which quantum dots are dispersed in a resin. In an embodiment, the second quantum dot layer 620 may include scattering particles.

The light-transmitting layer 630 may overlap the third central area CA3. The light-transmitting layer 630 may fill the third opening COP3. The third pixel PX3 may include the third organic light-emitting diode OLED3 and the light-transmitting layer 630.

The light-transmitting layer 630 may emit light generated in the light-emitting layer 320 on the third pixel electrode 313 to the outside without wavelength conversion. For example, when light having a wavelength of 450 nm to 495 nm is generated from the light-emitting layer 320 on the third pixel electrode 313, the light-transmitting layer 630 may emit the light to the outside without wavelength conversion. In an embodiment, the light-transmitting layer 630 may not include quantum dots. In an embodiment, the light-transmitting layer 630 may include scattering particles.

In an embodiment, a quantum dot included in the first quantum dot layer 610 may include a semiconductor material. The size of the quantum dot may be several nanometers, and the wavelength of light after conversion may vary according to the size of the quantum dot.

In an embodiment, a core of the quantum dot may be selected from at least one of is a Group II-VI compound, a Group III-V compound, a Group IV-VI compound, a Group IV element, and a Group IV compound, or any suitable combination of one or more of the aforementioned compounds.

The Group II-VI compound may be at least one of a binary compound selected from a group consisting of CdSe, CdTe, ZnS, ZnSe, ZnTe, ZnO, HgS, HgSe, HgTe, MgSe, MgS and any suitable mixture of one or more of the aforementioned materials; a ternary compound selected from a group consisting of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and any suitable mixture of one or more of the aforementioned materials; and a quaternary compound selected from a group consisting of HgZnTeS, CdZnSeS, CdZnSeTe, CdZnSTe, CdHgSeS, CdHgSeTe, CdHgSTe, HgZnSeS, HgZnSeTe, HgZnSTe and any suitable mixture of one or more of the aforementioned materials.

The Group III-V compound may be at least one of a two elements compound selected from a group consisting of GaN, GaP, GaAs, GaSb, AlN, AlP, AlAs, AlSb, InN, InP, InAs, InSb and any suitable mixture of one or more of the aforementioned materials; a three elements compound selected from a group consisting of GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP and any suitable mixture of one or more of the aforementioned materials; and a four elements compound selected from a group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and any suitable mixture of one or more of the aforementioned materials.

The Group IV-VI compound may be selected from the group consisting of a binary compound selected from the group consisting of SnS, SnSe, SnTe, PbS, PbSe, PbTe and is any suitable mixture of one or more of the aforementioned materials; a ternary compound selected from the group consisting of SnSeS, SnSeTe, SnSTe, PbSeS, PbSeTe, PbSTe, SnPbS, SnPbSe, SnPbTe and any suitable mixture of one or more of the aforementioned materials; and a quaternary compound selected from the group consisting of SnPbSSe, SnPbSeTe, SnPbSTe and any suitable mixture of one or more of the aforementioned materials. The Group IV element may be selected from the group consisting of Si, Ge, and any suitable mixture of one or more of the aforementioned materials. The Group IV compound may be a binary compound selected from the group consisting of SiC, SiGe, and any suitable mixture of one or more of the aforementioned materials.

In this case, the binary compound, the ternary compound, or the quaternary compound may exist in a particle with a uniform concentration, or may be in partially different concentration distributions in the same particle. In addition, one quantum dot may have a core/shell structure surrounding another quantum dot. An interface between the core and the shell may have a concentration gradient in which the concentration of an element in the shell decreases toward the center.

In some embodiments, the quantum dot may have a core-shell structure including the core described above and a shell surrounding the core. The shell of the quantum dot may serve as a protective layer for maintaining semiconductor properties by preventing chemical modification of the core and/or as a charging layer for imparting electrophoretic properties to the quantum dot. The shell may be a single layer or multiple layers. An interface between a core and a shell may have a concentration gradient. In this case, a concentration of an element in the shell decreases towards a center of the shell. Examples of the shell of the quantum dot may include a metal or non-metal oxide, a semiconductor compound, or any suitable mixture of one is or more of the aforementioned materials/compounds.

For example, the metal or non-metal oxide may be exemplified by a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and/or the like, or a ternary compound, such as $MgAl_2O_4$, $CoFe_2O_4$, $NiFe_2O_4$, $CoMn_2O_4$, and/or the like, but embodiments are not limited thereto.

In addition, the semiconductor compound may be exemplified by CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and/or the like, but embodiments are not limited thereto.

The quantum dot may have a full width at half maximum (FWHM) of an emission wavelength spectrum of about 45 nm or less, e.g., about 40 nm or less, such as about 30 nm or less, and in this range, color purity and color reproducibility may be improved. In addition, at least because light emitted through the quantum dot is emitted in all directions, a wide viewing angle may be improved.

In addition, the form of the quantum dot is not particularly limited to those generally used in the art, and may be spherical, pyramidal, multi-arm, cubic nanoparticles, nanotubes, nanowires, nanofibers, nanoplatelets, etc.

The quantum dot may control the color of light emitted according to the particle size, and accordingly, the quantum dot may have various light-emitting colors, such as blue, red, and green.

In an embodiment, the first quantum dot layer 610 may include scattering particles. The scattering particles included in the first quantum dot layer 610 may scatter incident light so that more light may be emitted. The scattering particles may increase light output efficiency. The scattering particles may be any material of metal or metal oxide for is evenly scattering light. Examples of a metal oxide for scattering particles may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and/or the like, and examples of an organic material for scattering particles may include an acrylic resin and/or a urethane resin. The scattering particles may scatter light in various directions regardless of an incident angle without substantially converting a wavelength of the incident light. Through this, the scattering particles may improve side visibility of the display device 1. In addition, the scattering particles may increase light conversion efficiency by increasing the probability that incident light meets quantum dots.

The resin included in the first quantum dot layer 610 may be a light-transmitting material. For example, a polymer resin, such as acrylic resin, imide resin, epoxy resin, BCB, and/or HMDSO may be used as a material for forming the first quantum dot layer 610. The material for forming the first quantum dot layer 610 may be located in the first opening COP1 of the bank layer 500 overlapping the first pixel electrode 311 through inkjet printing.

In an embodiment, the second quantum dot layer 620 may have a form in which quantum dots are dispersed in a resin. In an embodiment, the second quantum dot layer 620 may include scattering particles. For the quantum dots, scattering particles, and resin included in the second quantum dot layer 620, the description of the quantum dots, scattering particles, and resin included in the first quantum dot layer 610 may be applied.

In an embodiment, the light-transmitting layer 630 may include a light-transmitting resin, for example, acryl, BCB, and/or HMDSO. In an embodiment, the light-transmitting layer 630 may include scattering particles and not include quantum dots. For the scattering particles included in the light-transmitting layer 630, the description of the scattering particles included in the first quantum dot layer 610 may be applied. In some cases, unlike is shown in FIG. 4, the light-transmitting layer 630 may not exist in the third opening COP3 of the bank layer 500.

A protective layer 700 may be arranged on the bank layer 500 and the functional layer 600. The protective layer 700 may protect the bank layer 500 and the functional layer 600. The protective layer 700 may prevent or reduce impurities, such as moisture and/or air, from penetrating from the outside to damage or contaminate the bank layer 500 and/or the functional layer 600. The protective layer 700 may include an inorganic material.

In some embodiments, a spacer may be further arranged on the protective layer 700. The spacer may maintain a gap between the display panel 10 and the color conversion panel 20.

In some embodiments, a filler may be between the display panel 10 and the color conversion panel 20. The filler may act as a buffer against external pressure and the like. The filler may be formed of an organic material, such as methyl silicone, phenyl silicone, and/or polyimide. However, embodiments are not limited thereto. For instance, the filler may be formed of an organic sealant, such as a urethane resin, an epoxy resin, and/or an acrylic resin, and/or an inorganic sealant, such as silicone.

In the display device 1 as described above, light of a second wavelength band may be emitted from the first pixel PX1 to the outside, light of a third wavelength band may be emitted from the second pixel PX2 to the outside, and light of a first wavelength band may be emitted from the third pixel PX3 to the outside. As such, the display device 1 may display a full-color image.

In the auxiliary opening AOP, the first color filter 410, the second color filter 420, and the third color filter 430 may overlap each other. As described above, the first color filter 410, the second color filter 420, and the third color filter 430 may overlap and serve as a light shielding unit without a separate light shielding member. In an embodiment, the third color filter 430 may be first stacked on the upper substrate 400 in an area overlapping the first auxiliary opening AOP1, and the first color filter 410 and the second color filter 420 may be sequentially stacked. In another embodiment, the second color filter 420 may be stacked while being overlapped between the third color filter 430 and the first color filter 410.

A thickness $t_1$ (of FIG. 4) of the color filter layer CF overlapped on the auxiliary opening AOP (e.g., the first auxiliary opening AOP1) may be less than about 10 μm, such as less than about 8 μm, e.g., about 4 to about 6 μm. However, embodiments are not limited thereto.

In an embodiment, the functional layer 600 may not be filled in the auxiliary opening AOP. The auxiliary opening AOP may have a structure to increase reliability of the display device 1. The functional layer 600 may be arranged in the central opening COP of the bank layer 500. In an embodiment, the first quantum dot layer 610 may be in the first opening COP1, the second quantum dot layer 620 may be in the second opening COP2, and the light-transmitting layer 630 may be in the third opening COP3.

For example, the functional layer 600 may be formed by an inkjet printing process. When the functional layer 600 is formed by discharging ink through the central opening COP, correct alignment between an inkjet outlet and the central opening COP may be required. When the correct alignment between the inkjet discharge port and the central opening COP is not achieved, the functional layer 600 may be formed on an upper surface of the bank layer 500 or located in another central opening COP. For example, a material for forming the second quantum dot layer 620 may not be arranged in the second opening COP2, but may be arranged in the first opening COP1 or the third opening COP3.

In an embodiment, the central opening COP and the auxiliary opening AOP arranged adjacent to the central opening COP are defined in the bank layer 500, and thus, it is possible to prevent or reduce formation of the functional layer 600 on the upper surface of the bank layer 500 or a flow of the material for forming the functional layer 600 into other central openings COP. For example, the first auxiliary opening AOP1 may prevent or reduce a flow of the material for forming the second quantum dot layer 620 into the first opening COP1 or the third opening COP3. In an embodiment, even if the material for forming the second quantum dot layer 620 is not located in the second opening COP2 in a process of discharging the same, the material can be located in the adjacent first auxiliary opening AOP1, thereby reducing the probability that the material will be located in the first opening COP1 or the third opening COP3.

The protective layer 700 for protecting the functional layer 600 formed in the central opening COP, e.g., the first quantum dot layer 610, the second quantum dot layer 620, and the light-transmitting layer 630, may be located on the bank layer 500 and the functional layer 600. The protective layer 700 may be formed to extend to the auxiliary opening AOP. In an embodiment, when no material is present in the first auxiliary opening AOP1, the protective layer 700 may cover an inner surface and a bottom surface of the first auxiliary opening AOP1 as shown in FIG. 4.

In an embodiment, the central opening COP corresponding to a pixel unit and the auxiliary opening AOP arranged adjacent to the central opening COP are defined in the bank layer 500, and the auxiliary opening AOP may be overlapped with the auxiliary light-emitting device OLEDb so that, when a defect occurs in the pixel unit, a replacement pixel unit replacing the defective pixel unit may be formed using the auxiliary opening AOP adjacent to the central opening COP.

In an embodiment, when a defect occurs in the second quantum dot layer 620 arranged in the second opening COP2 corresponding to the second pixel PX2, a replacement pixel may be formed using the first auxiliary opening AOP1 arranged adjacent to the second opening COP2, and the second pixel PX2 may be replaced with the formed replacement pixel.

As a comparative example of various embodiments, when a defect occurs in a pixel unit, for example, when the function of a functional layer formed in a central opening decreases and dark spots occur, after the functional layer is removed, a functional layer may be re-formed by re-injecting ink. In this case, in general, the functional layer may have a thickness of, for example, about 10 μm, and may include quantum dots and scattering particles, such as $TiO_2$, and thus, may not be easily removed. Accordingly, because it takes a long time to repair a defective pixel unit or the number of repairs is limited, a panel may be discarded even with a small number of defects, thereby reducing a panel production rate.

According to various embodiments, when a defect occurs in a pixel unit, the defective pixel unit may be replaced by forming a replacement pixel unit using the auxiliary opening AOP adjacent to the central opening COP. In this case, because a process of removing the functional layer 600 is not performed, the time to repair the pixel unit is reduced, and the defective pixel unit may be easily replaced with the replacement pixel unit by supplying/cutting off power to a light-emitting device. Accordingly, with a small number of defects, a panel is not discarded, which may increase the panel-manufacturing yield and reduce the cost. Details of the repair method of the display device 1 related thereto will be described later below.

Figure 5:
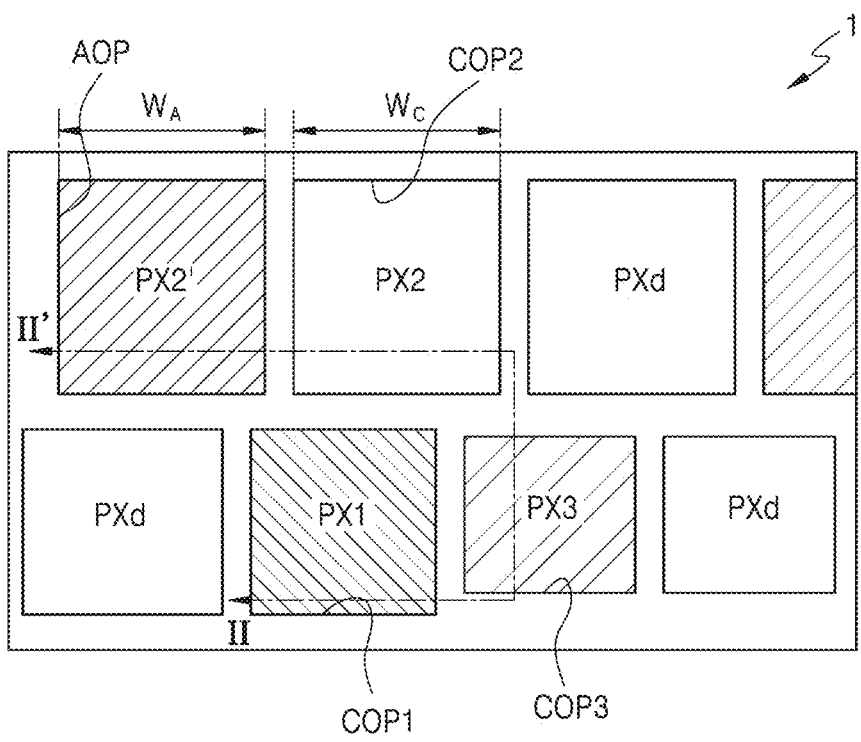
FIG. 5 is a plan view of a display device in which a defective pixel is repaired according to an embodiment.

FIG. 5 is a plan view of a display device in which a defective pixel is repaired according to an embodiment. FIGS. 6A to 6D are cross-sectional views of a display device at various stages of repair according to an embodiment. FIG. 7 is a cross-sectional view of the is display device of FIG. 5 taken along sectional line II-II' according to an embodiment. In FIGS. 5, 6A to 6D, and 7, the same reference numerals as used in FIG. 4 denote the same elements, and a duplicate description will not be given. FIGS. 6A to 6D show the color conversion panel 20 upside down.

Figure 6A:
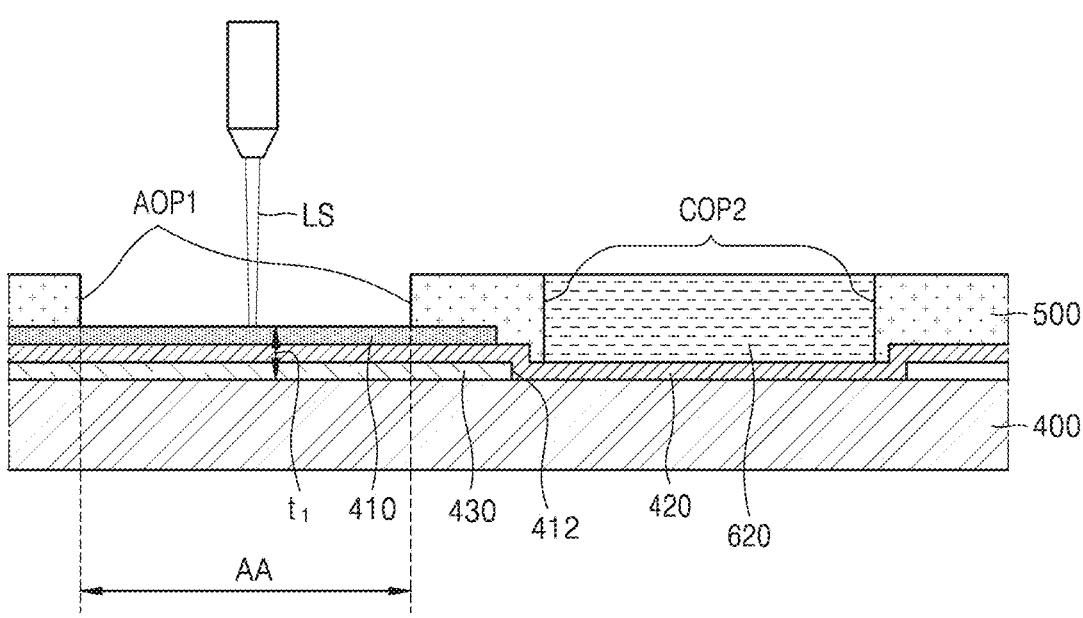
FIGS. 6A, 6B, 6C, and 6D are cross-sectional views of a display device at various stages of repair according to an embodiment.
Figure 6B:
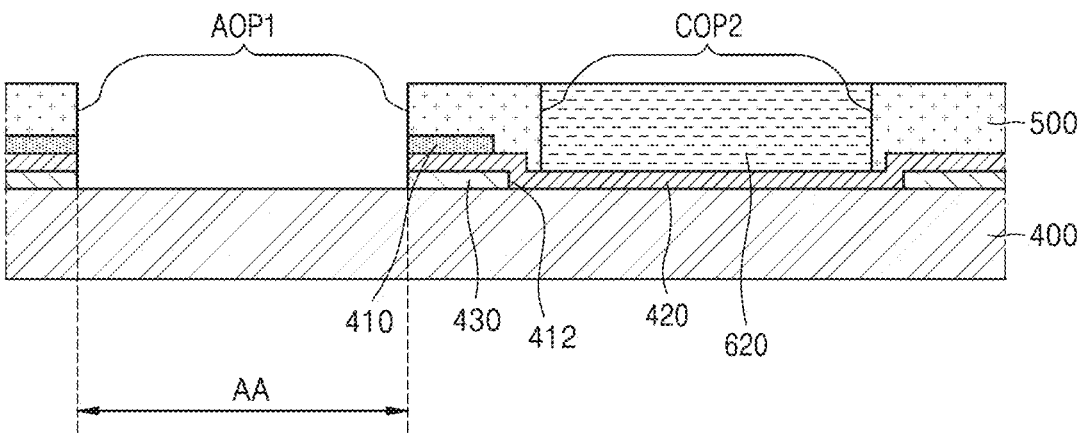

Referring to FIGS. 6A and 6B, when a defect occurs in a pixel unit, the color filter layer CF formed in the auxiliary opening AOP arranged adjacent to the central opening COP corresponding to the defective pixel unit may be removed. In an embodiment, the color filter layer CF arranged in an area AA overlapping the first auxiliary opening AOP1 may be removed. In the color filter layer CF arranged in the area AA overlapping the first auxiliary opening AOP1, the first color filter 410, the second color filter 420, and the third color filter 430 may overlap each other, and in this case, the thickness $t_1$ of the color filter layer CF arranged in the area AA overlapping the first auxiliary opening AOP1 may be less than about 10 pin, e.g., less than about 8 pin, such as about 4 to about 6 µm, but embodiments are not limited thereto.

The color filter layer CF may be removed by irradiating a laser beam LS. The laser beam may be irradiated to the selected first auxiliary opening AOP1. Accordingly, the color filter layer CF arranged in the area AA overlapping the first auxiliary opening AOP1 may be removed. The functional layer 600 is generally about 10 µm thick, and may not be easily removed because it may include quantum dots and scattering particles such as TiO₂, but the color filter layer CF is relatively thin and does not include quantum dots and scattering particles, so it can be easily removed.

Figure 6C:
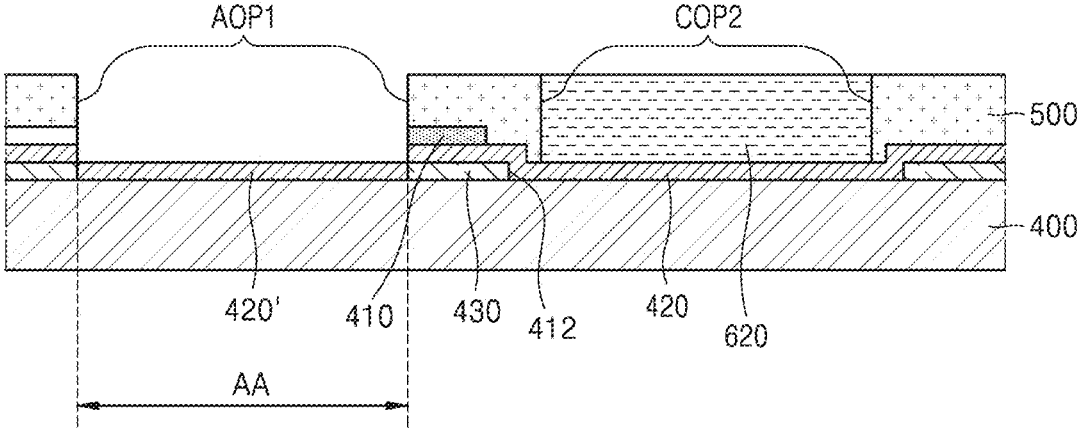

Referring to FIG. 6C, a single-layered color filter layer CF including the same material as that of a color filter layer CF corresponding to a defective pixel unit may be formed in an area from which the color filter layer CF is removed. In an embodiment, a color filter is layer 420' formed in the area AA overlapping the first auxiliary opening AOP1 may include the same material as that of the second color filter 420 overlapping the second opening COP2 corresponding to the second pixel PX2. In an embodiment, the color filter layer CF may be formed by discharging ink.

Figure 6D:
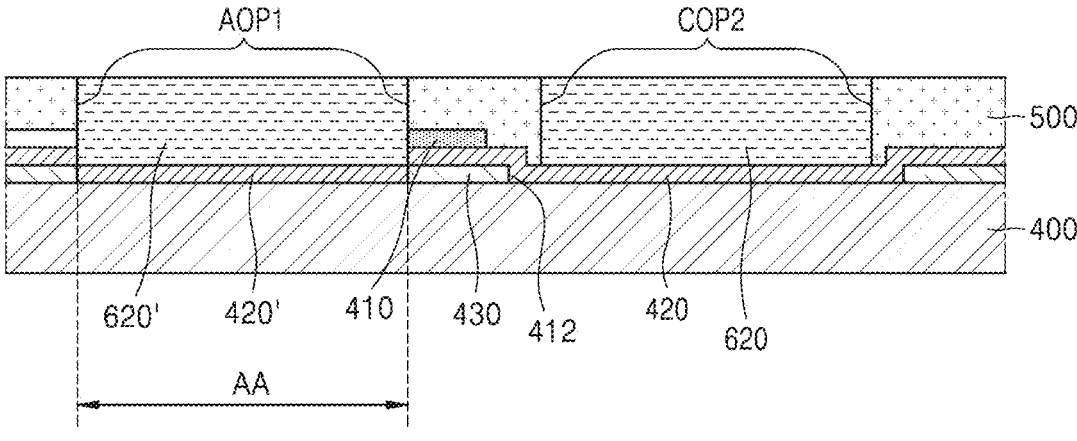

Referring to FIG. 6D, a functional layer 600 including the same material as that of the functional layer 600 corresponding to a defective pixel unit may be formed in an auxiliary opening. The functional layer 600 may include at least one of quantum dots and scattering particles. In an embodiment, a functional layer 620' formed on the color filter layer 420' in the first auxiliary opening AOP1 may include the same material as that of the second quantum dot layer 620 arranged in the second opening COP2. In an embodiment, the functional layer 600 may be formed by discharging ink.

A replacement pixel unit formed using the auxiliary opening AOP may include the same color filter layer CF and the same functional layer 600 as the color filter layer CF and the functional layer 600 corresponding to the defective pixel unit. Accordingly, the replacement pixel unit may emit light having the same color as that of the defective pixel unit. In an embodiment, a replacement pixel PX2' (see FIG. 5) formed using the first auxiliary opening AOP1 may include the same color filter layer 420' as the second color filter 420 of the second pixel PX2. The replacement pixel PX2' may include the same functional layer 620' as the second quantum dot layer 620 of the second pixel PX2. Accordingly, the replacement pixel PX2' may emit light having a wavelength of 495 nm to 570 nm through the upper substrate 400, similarly to the second pixel PX2.

Next, the replacement pixel PX2' may complete the repair of the display device 1 by attaching the color conversion panel 20 to the display panel 10.

FIG. 7 shows the display device 1 in which a replacement pixel unit is formed according to an embodiment.

Referring to FIG. 7, the display device 1 may include the upper substrate 400, the color filter layer CF, the bank layer 500, and the functional layer 600.

The upper substrate 400 may include the central area CA, which is an area corresponding to a pixel unit emitting colored light. The central area CA may include the first central area CA1 corresponding to the first pixel PX1, the second central area CA2 corresponding to the second pixel PX2, and the third central area CA3 corresponding to the third pixel PX3. In an embodiment, the central area CA may include a plurality of first central areas CA1, a plurality of second central areas CA2, and a plurality of third central areas CA3.

The bank layer 500 may be arranged on the upper substrate 400. A plurality of openings may be defined in the bank layer 500. In the bank layer 500, the central opening COP and the auxiliary opening AOP may be defined by partition walls. The central opening COP may include the first opening COP1 corresponding to the first pixel PX1, the second opening COP2 corresponding to the second pixel PX2, and a third opening COP3 corresponding to the third pixel PX3.

The auxiliary opening AOP may be arranged adjacent to the central opening COP. The auxiliary opening AOP may include a plurality of auxiliary openings. In an embodiment, each of the plurality of auxiliary openings may be arranged adjacent to at least one of the first opening COP1, the second opening COP2, and the third opening COP3.

The auxiliary opening AOP may have a size equal to or less than that of an adjacent central opening COP in a plan view. In an embodiment, each of the plurality of auxiliary openings may have a size equal to or less than a size of a nearest opening from among is the first opening COP1, the second opening COP2, and the third opening COP3.

The color filter layer CF may be between the upper substrate 400 and the bank layer 500. The color filter layer CF may include the first color filter 410 corresponding to the first pixel PX1, the second color filter 420 corresponding to the second pixel PX2, and the third color filter 430 corresponding to the third pixel PX3. Before forming a replacement pixel unit, in the auxiliary opening AOP, the first color filter 410, the second color filter 420, and the third color filter 430 may overlap each other.

When a defect occurs in a pixel unit, the auxiliary opening AOP arranged adjacent to the central opening COP corresponding to the defective pixel unit may be selected. In a plurality of auxiliary openings, an auxiliary opening closest to an opening corresponding to the defective pixel unit from among the first opening COP1, the second opening COP2, and the third opening COP3 may be selected. A replacement pixel unit capable of replacing the defective pixel unit may be formed using the selected auxiliary opening AOP. In an embodiment, the first auxiliary opening AOP1 arranged adjacent to the second opening COP2 corresponding to the second pixel PX2 in which a defect has occurred may be selected. The replacement pixel PX2' replacing the second pixel PX2 may be formed using the selected first auxiliary opening AOP1.

Referring to FIG. 7, the auxiliary light-emitting device OLEDb may be arranged on the lower substrate 100 overlapping the auxiliary opening AOP in which a replacement pixel unit is formed. A defective pixel unit may be replaced using the replacement pixel unit. Power supply to the main light-emitting device OLEDa overlapping the defective pixel unit may be cut off, and power may be supplied to the auxiliary light-emitting device OLEDb overlapping the replacement pixel unit. As shown in FIG. 5, by supplying power to the auxiliary light-emitting diode OLEDb overlapping the replacement pixel PX2' and cutting off power supply to the second organic light-emitting diode OLED2 overlapping the defective second pixel PX2, the second pixel PX2 may be replaced with the replacement pixel PX2'.

Figure 8:
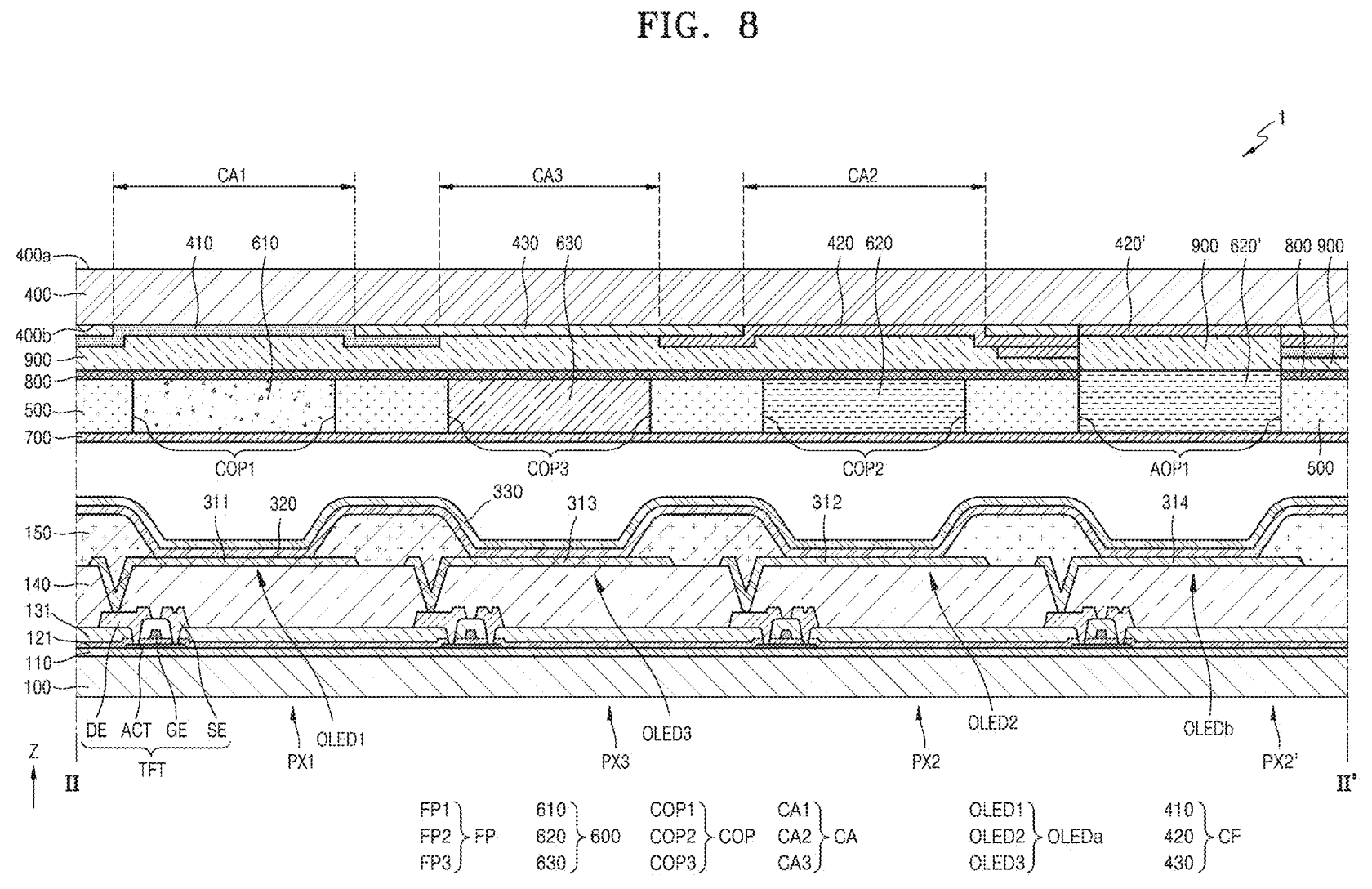

FIG. 8 is a cross-sectional view of a portion of the display device 1 according to an embodiment. In FIG. 8, the same reference numerals as used in FIGS. 5 and 6A to 6D denote the same elements, and a duplicate description will not be given. FIG. 8 shows the display device 1 in which a replacement pixel unit is formed.

Referring to FIG. 8, the display device 1 may further include a low refractive index layer 900 between the first quantum dot layer 610, the second quantum dot layer 620, the light-transmitting layer 630, and the bank layer 500 and the first color filter 410, the second color filter 420, and the third color filters 430. In addition, an additional protective layer 800 may be further provided between the first quantum dot layer 610, the second quantum dot layer 620, the light-transmitting layer 630, and the bank layer 500 and the low refractive index layer 900.

The low refractive index layer 900 may include an organic material having a low refractive index, and may serve to increase the extraction efficiency in which light passing through the first quantum dot layer 610 and the second quantum dot layer 620 is extracted to the outside through the upper substrate 400. The additional protective layer 800 may include an inorganic material, such as silicon oxide and/or silicon nitride, and may prevent or reduce the penetration of impurities, such as moisture and/or air, from the outside together with the protective layer 700 to damage or contaminate the low refractive index layer 900, the color filter layer CF, the first quantum dot layer 610, the second quantum dot layer 620, or the like.

According to FIG. 8, together with the color filter layer CF formed in an area overlapping the auxiliary opening AOP, the low refractive index layer 900 and the additional protective layer 800 formed in the corresponding area may be removed. In an embodiment, the is color filter layer CF, the low refractive index layer 900, and the additional protective layer 800 arranged in the area AA overlapping the first auxiliary opening AOP1 may be simultaneously (or sequentially) removed.

The color filter layer CF, the low refractive index layer 900, and the additional protective layer 800 may be removed by irradiating a laser beam. The laser beam may be irradiated to the selected first auxiliary opening AOP1. Accordingly, the color filter layer CF, the low refractive index layer 900, and the additional protective layer 800 arranged in the area AA overlapping the first auxiliary opening AOP1 may be removed. The color filter layer CF, the low refractive index layer 900, and the additional protective layer 800 are relatively thin compared to the functional layer 600 and may be easily removed because they do not include quantum dots and scattering particles.

Referring to FIG. 8, after forming a color filter layer CF including the same material as that of the color filter layer CF corresponding to a defective pixel unit in an area where the color filter layer CF is removed, the low refractive index layer 900 may be further formed. In an embodiment, the color filter layer 420' including the same material as that of the second color filter 420 formed in the area AA overlapping the first auxiliary opening AOP1 may be formed, and the low refractive index layer 900 may be further formed on the color filter layer 420'. In an embodiment, like the color filter layer CF, the low refractive index layer 900 may be formed by discharging ink.

In an embodiment, the additional protective layer 800 may not be formed in a replacement pixel unit. Referring to FIG. 8, even if the additional protective layer 800 is not formed, the protective layer 700 is formed to cover the functional layer 600 and the bank layer 500 later. Accordingly, penetration of impurities, such as moisture and/or air, into the functional is layer 600 and the low refractive index layer 900 from the outside may be prevented or reduced.

According to various embodiments, a display device may include an auxiliary opening overlapping a light-emitting device and adjacent to the central opening, and a replacement pixel may be formed using the auxiliary opening to replace a defective pixel. As such, with a small number of defects, a panel is not discarded, which may increase the panel-manufacturing yield and reduce the cost. However, the scope of the disclosure is not limited to these effects.

Although certain embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A display device comprising a pixel unit configured to emit light, the display device comprising:
    a lower substrate;
    a plurality of light-emitting devices on the lower substrate;
    an upper substrate on the lower substrate, the plurality of light-emitting devices being between the upper substrate and the lower substrate;
    a bank layer on one surface of the upper substrate facing the lower substrate, the bank layer comprising partition walls defining a central opening corresponding to the pixel unit and an auxiliary opening adjacent to the central opening;
    a color filter layer between the upper substrate and the bank layer and overlapping the central opening and the auxiliary opening, the color filter layer comprising a plurality of color filters overlapping each other in a thickness direction; and
    a functional layer filling the central opening, the functional layer comprising at least one of quantum dots and scattering particles,
    wherein the plurality of light-emitting devices comprises a main light-emitting device overlapping the central opening and an auxiliary light-emitting device overlapping the auxiliary opening,
    wherein the color filters of the color filter layer comprising a first color filter overlapping a first opening of the central opening, a second color filter overlapping a second opening of the central opening, and a third color filter overlapping a third opening of the central opening,
    wherein the first color filter, the second color filter, and the third color filter overlap each other in the auxiliary opening.

2. The display device of claim 1, wherein, in a plan view, the auxiliary opening has a size less than or equal to a size of the central opening.

3. The display device of claim 1, wherein:
    the pixel unit comprises a first pixel, a second pixel, and a third pixel, the first to third pixels being configured to emit light of different colors than each other;
    the central opening comprises the first opening corresponding to the first pixel, the second opening corresponding to the second pixel, and the third opening corresponding to the third pixel;
    the auxiliary opening comprises a plurality of auxiliary openings; and
    each of the plurality of auxiliary openings is arranged adjacent to at least one of the first opening, the second opening, and the third opening.

4. The display device of claim 3, wherein the functional layer comprises a first quantum dot layer filling the first opening, a second quantum dot layer filling the second opening, and a light-transmitting layer filling the third opening.

5. The display device of claim 4, wherein:

each of the first quantum dot layer, the second quantum dot layer, and the light-transmitting layer comprises scattering particles;

the first quantum dot layer further comprises a first quantum dot; and the second quantum dot layer further comprises a second quantum dot.

6. The display device of claim 1, wherein a thickness of the color filter layer overlapping the auxiliary opening is greater than 0 μm and less than 10 μm.

7. The display device of claim 6, wherein:

the first quantum dot layer is configured to convert light having a wavelength belonging to a first wavelength band into light having a wavelength belonging to a second wavelength band; and the second quantum dot layer is configured to convert light having a wavelength belonging to the first wavelength band into light having a wavelength belonging to a third wavelength band.

8. The display device of claim 1, wherein each of the plurality of light-emitting devices comprises:

a pixel electrode;

an opposite electrode on the pixel electrode; and a light-emitting layer between the pixel electrode and the opposite electrode.

9. A display device comprising a pixel unit configured to emit light, the display device comprising:

a lower substrate;

a plurality of light-emitting devices on the lower substrate;

an upper substrate on the lower substrate, the plurality of light-emitting devices being between the upper substrate and the lower substrate;

a bank layer on one surface of the upper substrate facing the lower substrate, the bank layer comprising partition walls defining a central opening corresponding to the pixel unit and an auxiliary opening adjacent to the central opening;

a color filter layer between the upper substrate and the bank layer and overlapping the central opening and the auxiliary opening, the color filter layer comprising a plurality of color filters overlapping each other in a thickness direction;

a functional layer filling the central opening, the functional layer comprising at least one of quantum dots and scattering particles; and a low refractive index layer between the color filter layer and the functional layer, wherein the plurality of light-emitting devices comprises a main light-emitting device overlapping the central opening and an auxiliary light-emitting device overlapping the auxiliary opening, wherein the color filters of the color filter layer comprising a first color filter overlapping a first opening of the central opening, a second color filter overlapping a second opening of the central opening, and a third color filter overlapping a third opening of the central opening, wherein the first color filter, the second color filter, and the third color filter overlap each other in the auxiliary opening.

10. The display device of claim 3, wherein, in a plan view, each of the plurality of auxiliary openings has a size less than or equal to a size of a nearest opening from among the first opening, the second opening, and the third opening.

11. The display device of claim 1, wherein the functional layer is not filled in the auxiliary opening.

* * * * *